United States Patent
Anasako et al.

(10) Patent No.: US 6,911,878 B2
(45) Date of Patent: Jun. 28, 2005

(54) ACOUSTIC WAVE BRANCHING FILTER HAVING TRANSMITTING FILTER WITH OPTIMAL POWER HANDLING

(75) Inventors: Kenichi Anasako, Tokyo (JP); Yoshiaki Fujita, Kanagawa (JP); Hisanori Ehara, Tokyo (JP); Tomokazu Komazaki, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/273,887

(22) Filed: Oct. 21, 2002

(65) Prior Publication Data

US 2003/0117233 A1 Jun. 26, 2003

(30) Foreign Application Priority Data

Oct. 26, 2001 (JP) ........................ 2001-328692

(51) Int. Cl.[7] .............................. H03M 9/64; H03M 9/72
(52) U.S. Cl. ........................ 333/133; 333/193
(58) Field of Search ........................ 333/133, 193–196

(56) References Cited

U.S. PATENT DOCUMENTS

| | | | | |
|---|---|---|---|---|
| 5,471,178 A | * | 11/1995 | Hickernell | ................. 333/193 |
| 5,786,738 A | * | 7/1998 | Ikata et al. | ................. 333/133 |
| 5,831,493 A | * | 11/1998 | Ushiroku | .................. 333/193 |
| 5,905,418 A | * | 5/1999 | Ehara et al. | ................ 333/193 |
| 6,208,223 B1 | | 3/2001 | Shimamura et al. | ........ 333/193 |
| 6,208,224 B1 | | 3/2001 | Taniguchi et al. | ........... 333/193 |
| 6,380,823 B1 | * | 4/2002 | Ikata et al. | ................. 333/133 |
| 6,480,075 B1 | * | 11/2002 | Fujita et al. | ................ 333/193 |
| 6,489,860 B1 | * | 12/2002 | Ohashi | ...................... 333/133 |
| 6,522,219 B2 | * | 2/2003 | Takamiya et al. | ........... 333/133 |

FOREIGN PATENT DOCUMENTS

| | | |
|---|---|---|
| JP | 06-029779 | 2/1994 |
| JP | 10-303682 | 11/1998 |

\* cited by examiner

*Primary Examiner*—Barbara Summons
(74) *Attorney, Agent, or Firm*—Volentine Francos & Whitt PLLC

(57) ABSTRACT

A surface acoustic wave filter includes an antenna terminal, a transmitting filter and a variable branching line both of which are coupled to the antenna terminal and a receiving filter coupled to the variable branching line. The transmitting filter has a first end series-arm SAW resonator, a second end series-arm SAW resonator, a middle series-arm SAW resonator coupled between the first and second end series-arm SAW resonators and parallel-arm SAW resonators. Each of the first and second end series-arm SAW resonator has a first resonance frequency. The middle series-arm SAW resonator has a second resonance frequency that is higher than the first resonance frequency.

11 Claims, 7 Drawing Sheets

ACOUSTIC WAVE BRANCHING FILTER HAVING TRANSMITTING FILTER WITH OPTIMAL POWER HANDLING

BACKGROUND OF THE INVENTION

The present invention relates to surface acoustic wave branching filters comprising band-pass filters having ladder constructions with surface acoustic wave resonators, in small-size mobile communication instruments such as portable telephones, particularly to surface acoustic wave branching filters usable even in case of high applied powers.

In recent years, developments of small-size, light mobile communication instruments such as portable telephones have been rapidly advanced. With this, reduction in size and improvement in performance of parts to be used have been pursued. To cope with this tendency, RF (Radio Frequency) parts using surface acoustic wave (hereinafter referred to as SAW) filters have been developed and used. In particular, SAW branching filters have been actively developed and part of them have been put in practical use and used because they are devices for largely contributing reduction in size of RF parts.

A SAW filter includes a transmission filter (hereinafter referred to as Tx filter), a reception filter (hereinafter referred to as Rx filter), and a branching line.

Since a high power is applied to the transmission filter, the transmission filter must be a SAW filter whose characteristics do not deteriorate even in the application of the high power. Such high-power SAW filters are disclosed in, e.g., Japanese Patent Application Laid-open Nos. 6-29779, 10-303682, and 11-251871.

As the filters used in the aforementioned prior arts, SAW filters are used in each of which the transverse length or the number of pairs of SAW resonators composing its transmission filter has been increased to increase the area per unit current and thereby raise its withstand power.

On the other hand, a SAW branching filter in a mobile communication terminal device such as a portable telephone has a function in which one antenna is used for both of transmission and reception.

Further, for this branching filter required is a function in which there is no change in characteristics in either of:

(1) a case that the antenna is in a normal operation, i.e., a case that the input impedance of the antenna is 50 Ω; and (2) a case that the antenna is free, i.e., a case that the input impedance of the antenna is infinite.

In the above cases (1) and (2), because of a state of a rapid change in impedance, variation and break of SAW branching filter characteristics upon transmission in which a power is applied to the SAW branching filter, come into question. It is known that these variation and break of the SAW branching filter characteristics are caused by deterioration and break of a series-arm resonator of the transmission filter to which a high power is applied.

SUMMARY OF THE INVENTION

In view of the aforementioned problem, the present invention may suppress the deterioration and break of the series-arm resonator of a surface acoustic wave filter by decreasing the current flowing in the series arm and thereby lowering the applied power to the series arm.

A surface acoustic wave filter of the present invention includes an antenna terminal, a transmitting filter and a variable branching line both of which are coupled to the antenna terminal and a receiving filter coupled to the variable branching line. The transmitting filter has a first end series-arm SAW resonator, a second end series-arm SAW resonator, a middle series-arm SAW resonator coupled between the first and second end series-arm SAW resonators and parallel-arm SAW resonators. Each of the first and second end series-arm SAW resonator has a first resonance frequency. The middle series-arm SAW resonator has a second resonance frequency that is higher than the first resonance frequency.

DETAILED DESCRIPTION OF THE PREFERRED EMBODIMENTS

Before the description of embodiments of the present invention, a mounted state of a SAW branching filter will be described.

Figure 6:
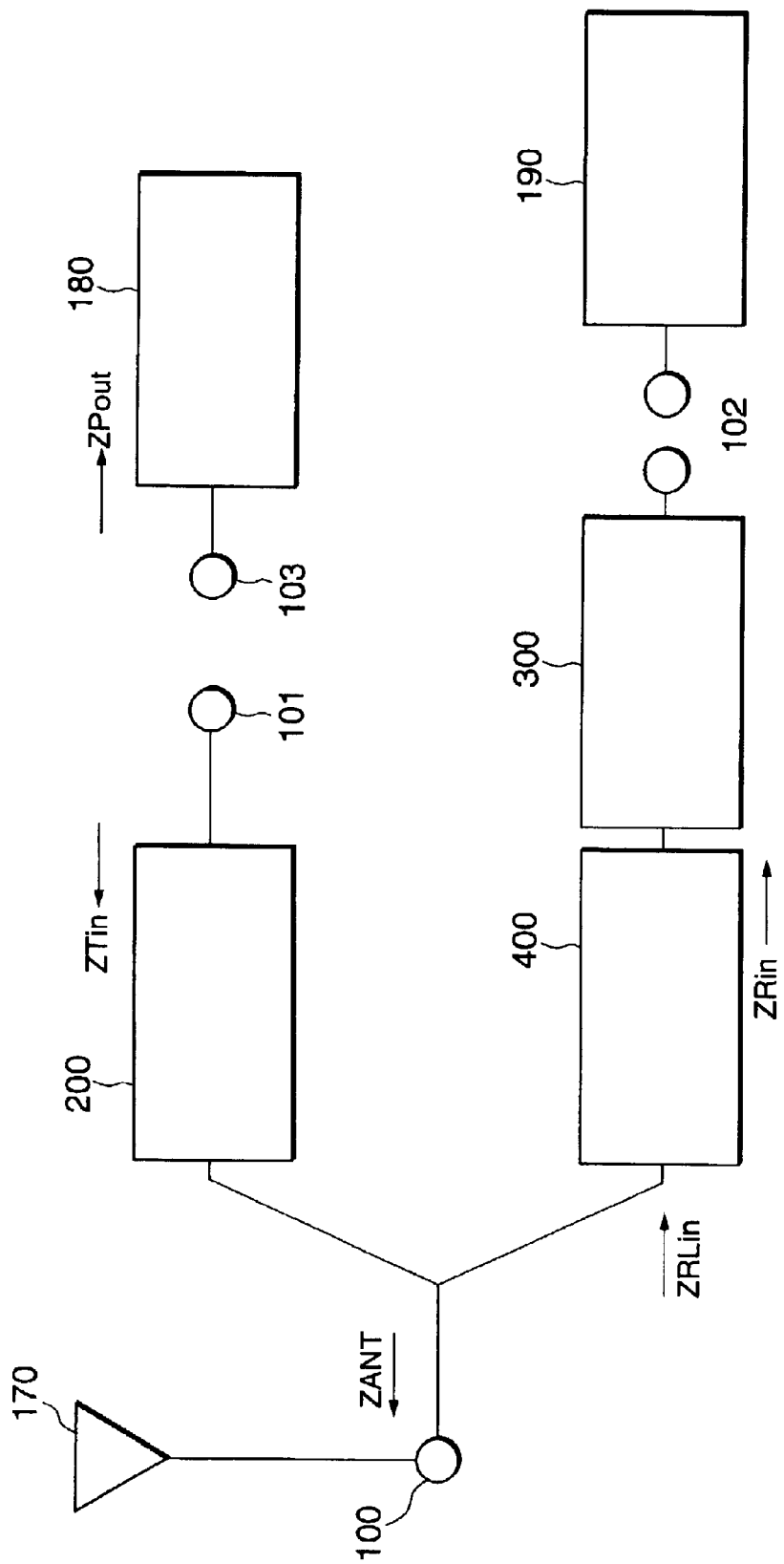
FIG. 6 is a circuit diagram of a SAW branching filter in a mounted state.

FIG. 6 is a circuit diagram of a SAW branching filter in a mounted state.

This SAW branching filter is connected with an antenna 170 at an ANT terminal 100, a transmission power amplifier 180 at a Tx terminal 101, for outputting a high power, and a low-noise amplifier 190 at an Rx terminal 102, for amplifying a received small signal.

Next, the first embodiment will be described.

Figure 1:
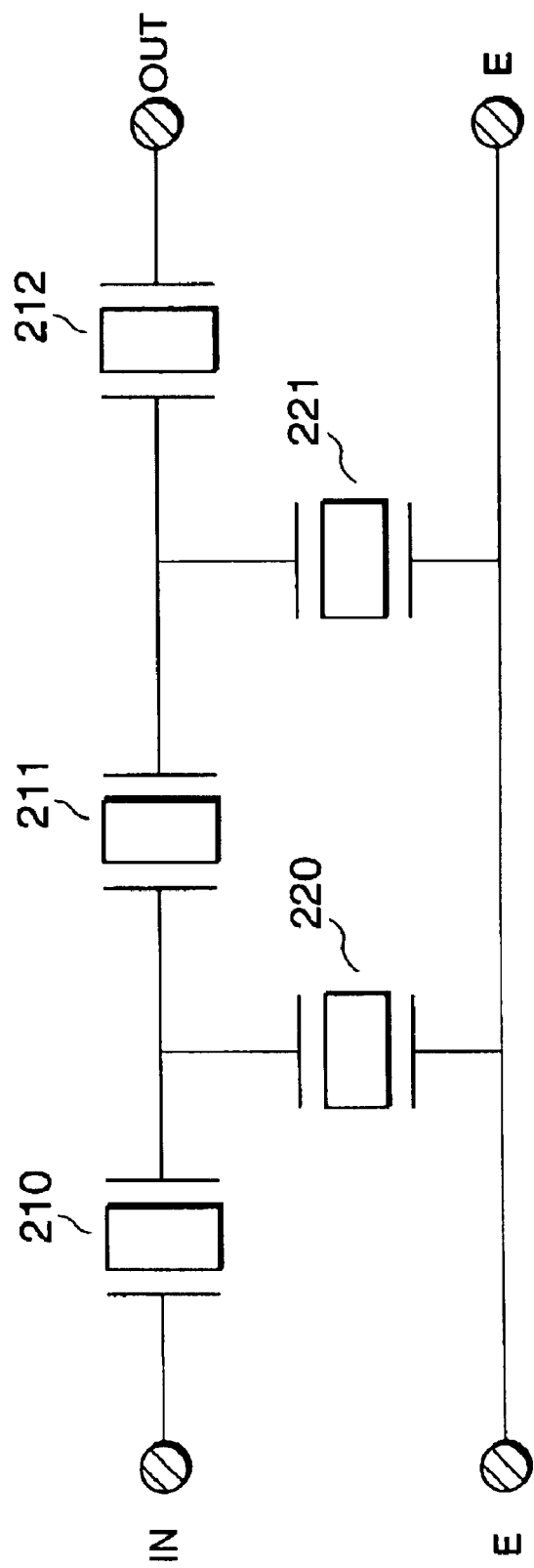
FIG. 1 is a circuit diagram of a Tx filter of the first embodiment of the present invention.

FIG. 1 is a circuit diagram of a Tx filter 200 of the first embodiment of the present invention.

In the terminal device for mobile communication, such as a portable telephone, illustrated in FIG. 6, in general, the output impedance ZPout at a PA terminal 103 as an output terminal of a power amplifier 180 is regulated to 50 Ω. It is known that the output power of this power amplifier 180 becomes, at the Tx terminal 101 of the SAW branching filter, from the relation between the input impedance ZTin at Tx and the output impedance ZPout of the power amplifier 180, a power input from the Tx terminal 101 of the SAW branching filter to a Tx filter 200 and a power reflected from the Tx terminal 101 of the SAW branching filter to the PA terminal 103 of the power amplifier 180.

In the terminal device for mobile communication, such as a portable telephone, the Tx filter 200 of FIG. 6 is a four-stage T-type ladder filter made up of three series arms S1 210, S2 211, and S3 212, and two parallel arms P1 220 and P2 221 of FIG. 1. The transverse lengths and the number of pairs thereof are shown in Table 1.

TABLE 1

Transverse length, the number of pairs, equivalent LC value, and impedance value at 836 MHz of transmission filter

| Transmission filter | Series arm 1 | Series arm 2 | Series arm 3 | Parallel arm 1 | Parallel arm 2 | Parallel arm 3 | Parallel arm 4 |
| --- | --- | --- | --- | --- | --- | --- | --- |
| Transverse length/the number of pairs | 90μ100 | 45μ100 | 90μ100 | | 125μ85 | 125μ85 | |
| L1 (nH) | 153 | 306 | 153 | | 87.5 | 87.5 | |
| C1 (pF) | 0.237 | 0.118 | 0.237 | | 0.441 | 0.441 | |
| C0 (pF) | 2.96 | 1.48 | 2.96 | | 3.71 | 3.71 | |

Figure 3:
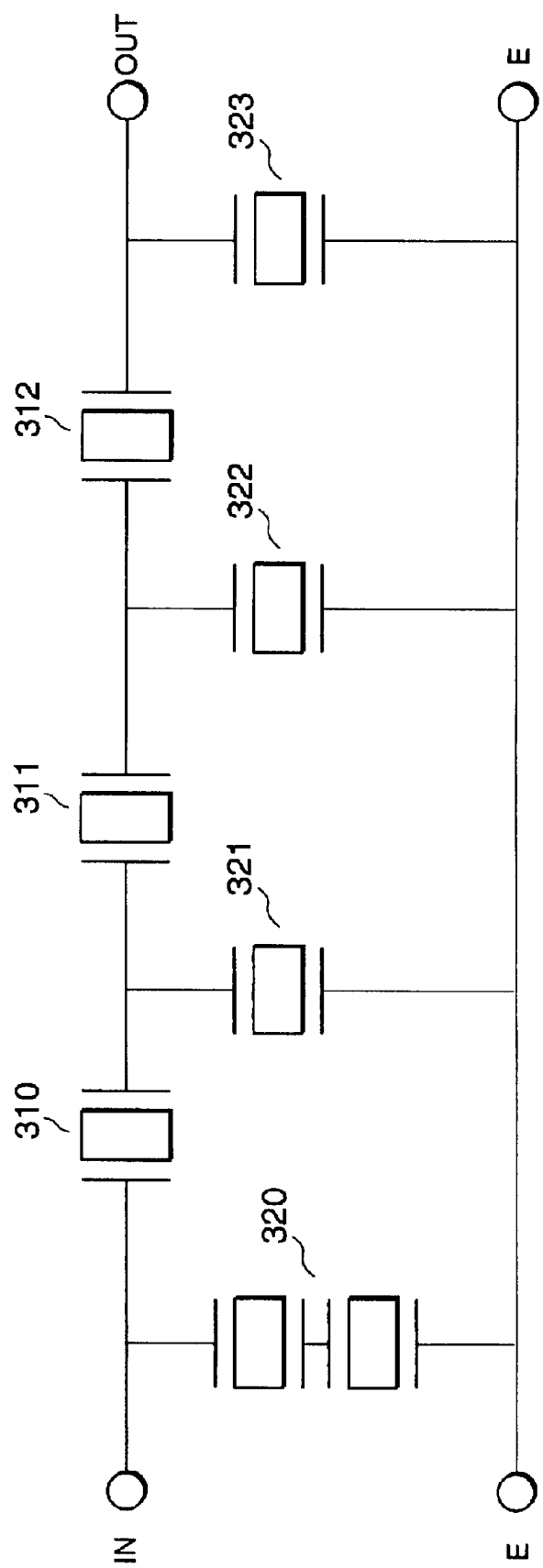
FIG. 3 is a circuit diagram of an Rx filter.

FIG. 3 is a circuit diagram of an Rx filter 300. As illustrated in FIG. 3, the Rx filter 300 is a six-stage π-type filter made up of three series arms S1 310, S2 311, and S3 312, and four parallel arms P1 320, P2 321, P3 322, and P4 323. The transverse lengths and the number of pairs thereof are shown in Table 2.

TABLE 2

Reception filter, the number of pairs, equivalent LC value, and impedance value at 836 MHz of transmission filter

| Reception filter | Series arm 1 | Series arm 2 | Series arm 3 | Parallel arm 1 | Parallel arm 2 | Parallel arm 3 | Parallel arm 4 |
| --- | --- | --- | --- | --- | --- | --- | --- |
| Transverse length/the number of pairs | 50μ100 | 50μ100 | 50μ100 | 70μ70 | 99μ99 | 90μ90 | 70μ70 |
| L1 (nH) | 159 | 159 | 159 | 194 | 97 | 97 | 194 |
| C1 (pF) | 0.201 | 0.201 | 0.201 | 0.181 | 0.362 | 0.362 | 0.181 |
| C0 (pF) | 2.51 | 2.51 | 2.51 | 1.77 | 3.55 | 3.55 | 1.77 |
| Q | 800 | 800 | 800 | 800 | 800 | 800 | 800 |

Figure 7:
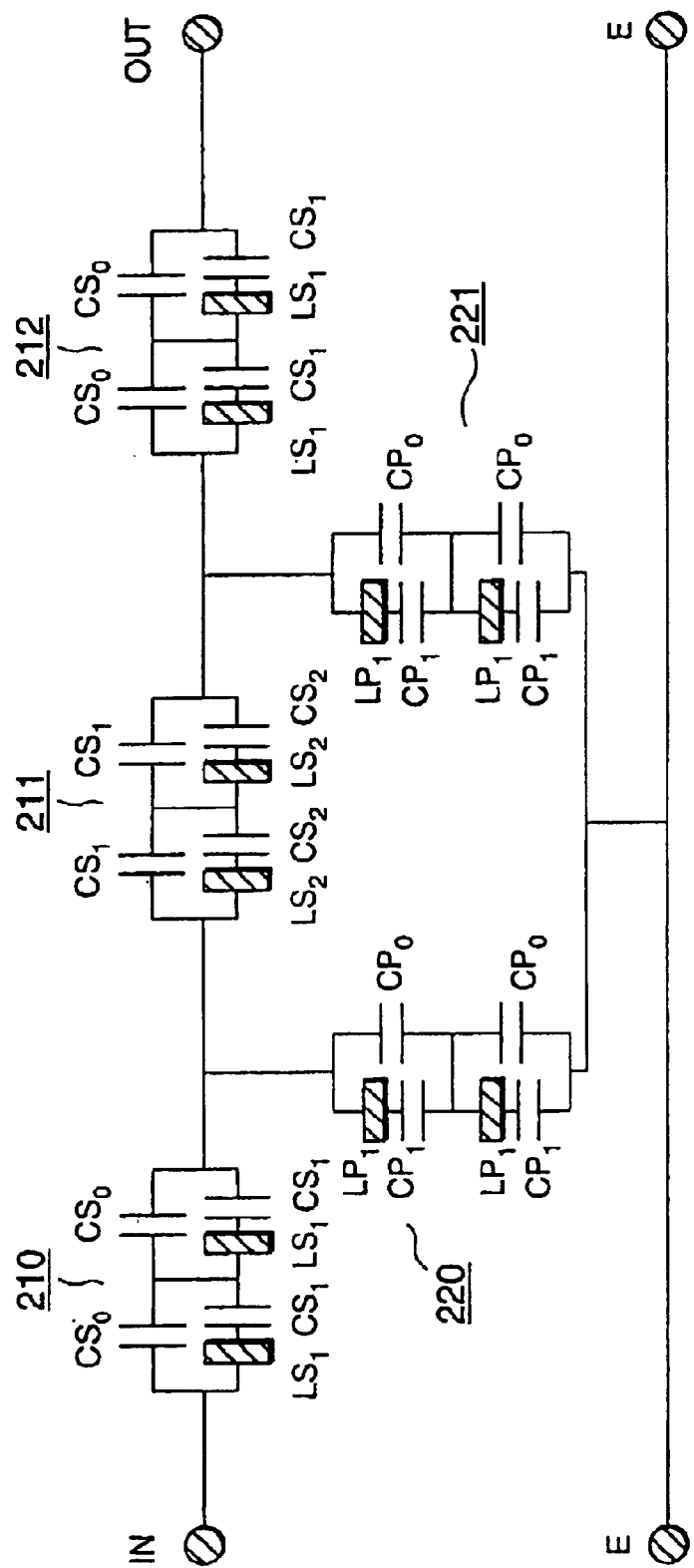
FIG. 7 is a concentrated-constant equivalent circuit diagram of a Tx filter.

FIG. 7 is a concentrated-constant equivalent circuit diagram of the Tx filter 200.

Figure 8:
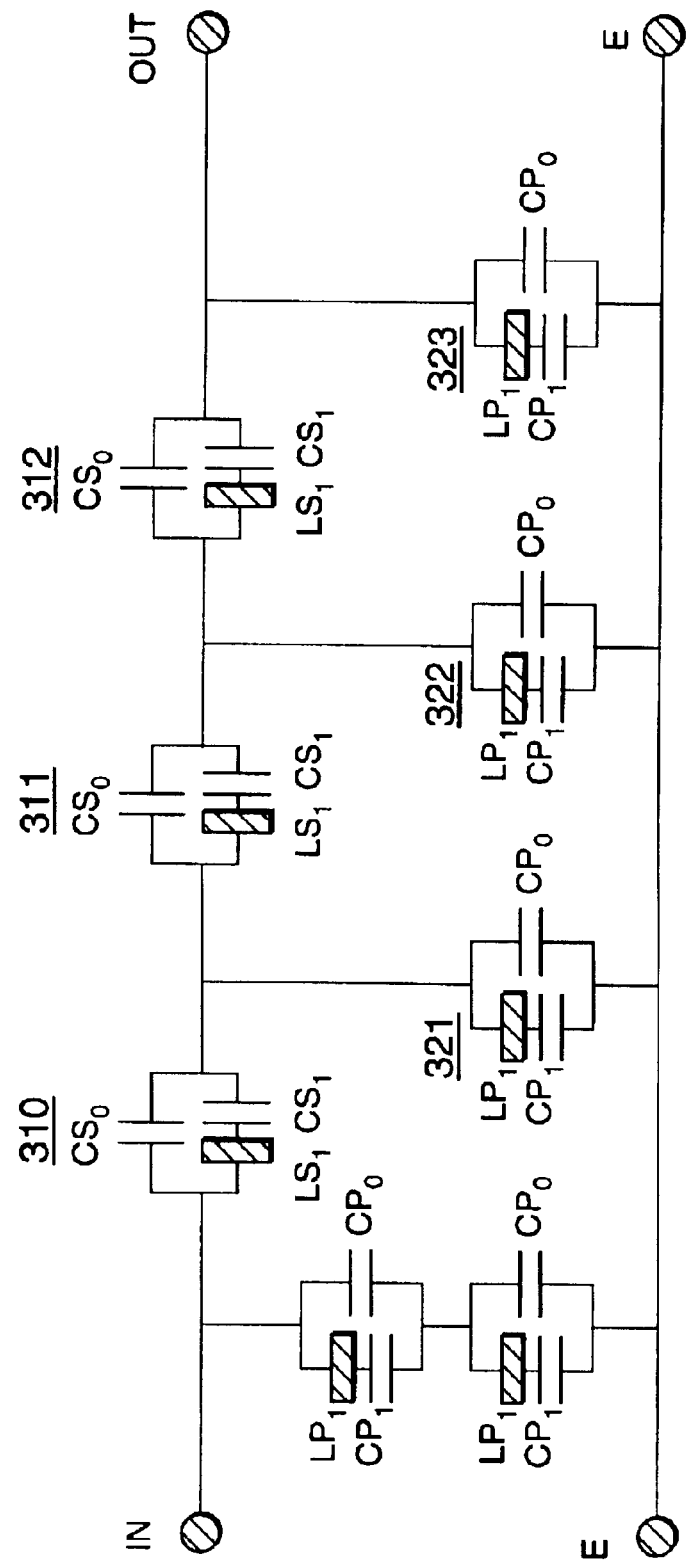
FIG. 8 is a concentrated-constant equivalent circuit diagram of an Rx filter.

FIG. 8 is a concentrated-constant equivalent circuit diagram of the Rx filter 300.

In FIG. 7, the series arms S1 210 and S3 212 compose a circuit in which two unit circuits in each of which a capacitance CS0 is connected in parallel with a series circuit of a reactance LS1 and a capacitance CS1 are connected in series; the series arm S2 211 composes a circuit in which two unit circuits in each of which the capacitance CS1 is connected in parallel with a series circuit of a reactance LS2 and a capacitance CS2 are connected in series; and the parallel arms P1 and P2 compose a circuit in which two unit circuits in each of which the capacitance CS0 is connected in parallel with a series circuit of a reactance LP1 and a capacitance CP1 are connected in series.

In FIG. 8, the series arms S1 310, S2 311, and S3 312 compose a circuit in which a capacitance CS0 is connected in parallel with a series circuit of a reactance LS1 and a capacitance CS1; the parallel arms P2, P3, and P4 compose a circuit in which a capacitance CP0 is connected in parallel with a series circuit of a reactance LP1 and a capacitance CP1; and the parallel arm P1 composes a circuit in which two unit circuits in each of which the capacitance CP0 is connected in parallel with a series circuit of the reactance LP1 and the capacitance CP1 are connected in series.

The equivalent LC value of each of the series and parallel arms is shown in Table 1. The first embodiment of the present invention relates to the construction of the ladder Tx filter (200) of FIG. 1, characterized in that, in the SAW branching filter of FIG. 6, upon transmission power input, the power applied to each series-arm resonator of the Tx filter is reduced.

There is a necessity of paying attention to the power input to the Tx filter 200 upon signal transmission. From FIG. 6, it is found that the input power of this Tx filter 200 is related to the input impedance ZTin of the Tx filter 200. That is, upon transmission, the load is in a state that the impedance ZRLin of the reception system made up of a branching line 400 and the Rx filter 300 is connected in parallel with the ANT terminal 100.

Here is a problem that, when the power applied to each resonator 210, 211, 212, 220, or 221 of FIG. 7 has risen, a current flows in the part of the resistance between the teeth of the comb caused by a finite Q of each resonator, heats are generated in the resonator because of this current, and the resonator is broken by these heats. Here, the resonator "Q" is assumed as:

Q=2π(accumulated energy)/(energy disappearing in one cycle)

=2πf(accumulated energy)/(disappearing power).

Figure 4:
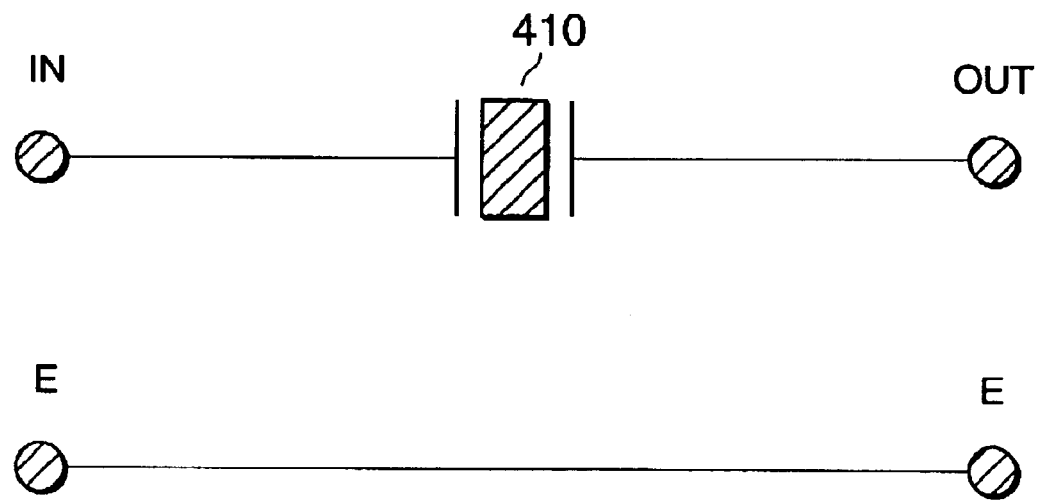
FIG. 4 is a circuit diagram of a series-arm SAW resonator.

FIG. 4 is a circuit diagram of a series-arm SAW resonator.

Figure 5:
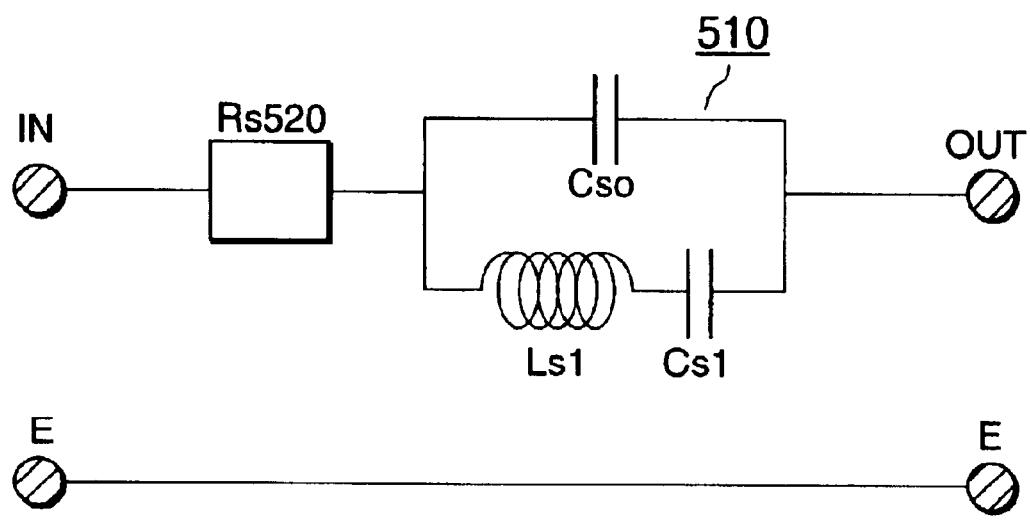
FIG. 5 is a concentrated-constant equivalent circuit diagram of the series-arm SAW resonator.

FIG. 5 is a concentrated-constant equivalent circuit diagram of the series-arm SAW resonator. FIG. 4 is a schematic diagram of the series-arm resonator S1 410 and FIG. 5 is a concentrated-constant equivalent circuit diagram of the series-arm resonator S 510 of FIG. 4, which is a circuit in which a series circuit of a capacitance Cs1 and a reactance Ls1 and a series circuit of a capacitance Cs0 are connected in parallel, and a resistance Rs 520 is connected in series with them.

In general, from the concentrated-constant circuit of the series-arm resonator S1 510 of FIG. 5, the resistance part due to a finite Q of the series-arm resonator S1 410 of FIG.

4 is evaluated as a resistance part Rs 520 and calculated. From the concentrated-constant equivalent circuit of the resonator, the resistance part Rs 520 due to the finite Q of the resonator of FIG. 5 is obtained as follows. Now assuming that Q of the resonator is a finite Q0, the impedance Z of the series-arm resonator including Q0 and the admittance Y of the parallel-arm resonator are given by the expression (1).

$$Z=1/Y=R_d+jZ_0=1/(G_d+jY_0) \quad (1)$$

$$G_d=\{\omega C_0+\omega C_1(1+\omega^2 {}^*L_1{}^*C_1)\}/\{(1-\omega^2 {}^*L_1{}^*C_1)^2\}/Q_0 \quad (2)$$

$$Y_0=\omega(C_0+C_1+\omega^2 L_1{}^*C_1{}^*C_0)/(1+\omega^2 {}^*L_1{}^*C_1) \quad (3)$$

In case that Q of each resonator is infinite, the impedance of the series-arm resonator is jZ0 and the admittance of the parallel-arm resonator is jY0. In each resonator, however, because of an actually finite Q, there are a minute resistance part Rd of the series-arm resonator and a minute conductance part Gd of the parallel-arm resonator.

From the equivalent LC value of each series-arm resonator of the Tx filter 200 of Table 1, assuming that Q of each resonator is 800, the resistance values of the Tx filter 200 at 824 MHz, 836 MHz, and 849 MHz obtained from the expressions (1), (2), and (3) are shown in Table 3.

TABLE 3

| Frequency (MHz) | | 824 | 836 | 849 |
|---|---|---|---|---|
| High-frequency resistance value Ω | Series arm 1,3 | 1.07 | 1.93 | 5.11 |
| | Series arm 2 | 2.14 | 3.77 | 10.2 |

High-frequency resistance of each series arm of first embodiment

When a transmission power is applied to the Tx filter 200, it is divided into an equivalent power and a reflection power, as illustrated in FIG. 6. This equivalent power is converted into heats by a high-frequency resistance of the Tx filter 200 shown in Table 3. Now, in Table 3, paying attention to a frequency 836 MHz, it is found that the resistance value of the series arm 2 is 3.77Ω and it has the resistance that is substantially double of 1.93Ω of the series arm 1 or 3. That is, it is found that the series arm 2 generates heats that are substantially double of those of the other series arms. When, based on this high-frequency resistance of Table 3, the current flowing in each series arm is obtained and the applied power to each series arm is obtained, the result is in Table 4.

TABLE 4

| Frequency (MHz) | Series arm 1 | Series arm 2 | Series arm 3 |
|---|---|---|---|
| 836 (MHz) | 0.0596428 | 0.074404 | 0.0299007 |

Applied power to each series arm of first embodiment (Unit: Watt)

From this Table 4, it is found that the highest power is applied to the series arm 2. That is, it is found that the series arm 2 is weakest to power. This is caused by that the high-frequency resistance is high as described above.

In general, the series arms of the Tx filter are set at the same resonance frequency. But, to reduce the applied power to the series arm 2, according to Table 3, if the frequency is changed, since the high-frequency resistance of each series arm changes, in the first embodiment of the present invention, by making the resonance frequencies of the series arm 1 and the series arm 3 and the series arm 2 of the Tx filter differ from each other, the high-frequency resistance of the series arm 2 of the Tx filter is set small, and by reducing the applied power, it can become a SAW branching filter in which the withstand power characteristic has been improved.

TABLE 5

Resistance and applied power of each series arm by change in resonance frequency of series arm 2 of first embodiment
Series arm 2

| | | High-frequency equivalent resistance value of each arm of Tx filter | | | | | Input impedance of Tx filter; Input power to input terminal of Tx filter | | | | |
|---|---|---|---|---|---|---|---|---|---|---|---|
| MHz | Conditions | R1 | R2 | R3 | R4 | R5 | real | imaginary | Power | Resistance part | Current (A) |
| 885 | 50 terminals | 1.93 | 15.00 | 1.93 | 15.00 | 1.93 | 72.80 | 28.60 | 0.92 | 72.80 | 0.112 |
| 881 | 50 terminals | 1.93 | 15.00 | 2.18 | 15.00 | 1.93 | 73.60 | 15.00 | 0.95 | 73.60 | 0.114 |
| 877 | 50 terminals | 1.93 | 15.00 | 2.59 | 15.00 | 1.93 | 65.80 | −1.24 | 0.98 | 65.80 | 0.122 |
| 873 | 50 terminals | 1.93 | 15.00 | 3.13 | 15.00 | 1.93 | 47.60 | −11.20 | 0.99 | 47.60 | 0.144 |
| 871 | 50 terminals | 1.93 | 15.00 | 3.45 | 15.00 | 1.93 | 37.30 | −11.20 | 0.96 | 37.30 | 0.161 |
| 869 | 50 terminals | 1.93 | 15.00 | 3.77 | 15.00 | 1.93 | 29.80 | −9.04 | 0.92 | 29.80 | 0.176 |

| | | Current and applied power of each arm of Tx filter | | | | | |
|---|---|---|---|---|---|---|---|
| MHz | Conditions | S1 (Watt) | P1 (Watt) | Current 3 (A) | S2 (Watt) | P2 (Watt) | Current 5 (A) | S3 (Watt) |
| 885 | 50 terminals | 0.02439 | 0.00246 | 0.09960 | 0.01915 | 0.00193 | 0.08825 | 0.01503 |
| 881 | 50 terminals | 0.02499 | 0.00313 | 0.09935 | 0.02152 | 0.00192 | 0.08803 | 0.01495 |
| 877 | 50 terminals | 0.02866 | 0.00483 | 0.10391 | 0.02797 | 0.00210 | 0.09206 | 0.01636 |

TABLE 5-continued

Resistance and applied power of each series arm by change in resonance frequency of series arm 2 of first embodiment
Series arm 2

| | | | | | | | | |
|---|---|---|---|---|---|---|---|---|
| 873 | 50 terminals | 0.04014 | 0.00930 | 0.00932 | 0.04456 | 0.00278 | 0.10572 | 0.02157 |
| 871 | 50 terminals | 0.04983 | 0.01354 | 0.13063 | 0.05887 | 0.00333 | 0.11574 | 0.02585 |
| 869 | 50 terminals | 0.05984 | 0.01876 | 0.14072 | 0.07465 | 0.00386 | 0.12468 | 0.03000 |

The first embodiment of the present invention is, as shown in Table 5, by setting the resonance frequency of the series arm 2 R3 from 869 MHz to the higher frequency side, to reduce the high-frequency resistance of the series arm 2 R3 form 3.77Ω at 869 MHz to 1.93Ω at 885 MHz, after all, to reduce the applied power to the series arm 2.

So, in the first embodiment of the present invention, as the means for changing the resonance frequency of the series arm 2, specifically, means for changing inter-electrode pitch of interdigital electrodes is employable. For example, in case of a grating reflector, assuming that the grating period (disposition intervals of metallic or dielectric strips) is p and the surface wave velocity is $v_0$, the central frequency $f_0$ of the reflector can be obtained from an expression $f_0=v_0/2p$. That is, in case of a fixed surface wave velocity, the resonance frequency of the series arm 2 can be changed by changing the grating period. Further, although the frequency characteristic is changed by the change in resonance frequency of the series arm 2, this change in frequency characteristic can be rectified by the transverse lengths and the number of pairs of the electrodes.

Table 5 substantially shows effects of the present invention. In general, every series arm is set at 869 MHz. Table 5 shows the resistance and applied power in relation to each series arm when the resonance frequency of the series arm 2 is changed to 869 MHz to 885 MHz. It is found that the applied power to the series arm 2 changes from 0.074W to 0.019W by changing the resonance frequency of the series arm 2 from 869 MHz to 885 MHz.

Figure 2:
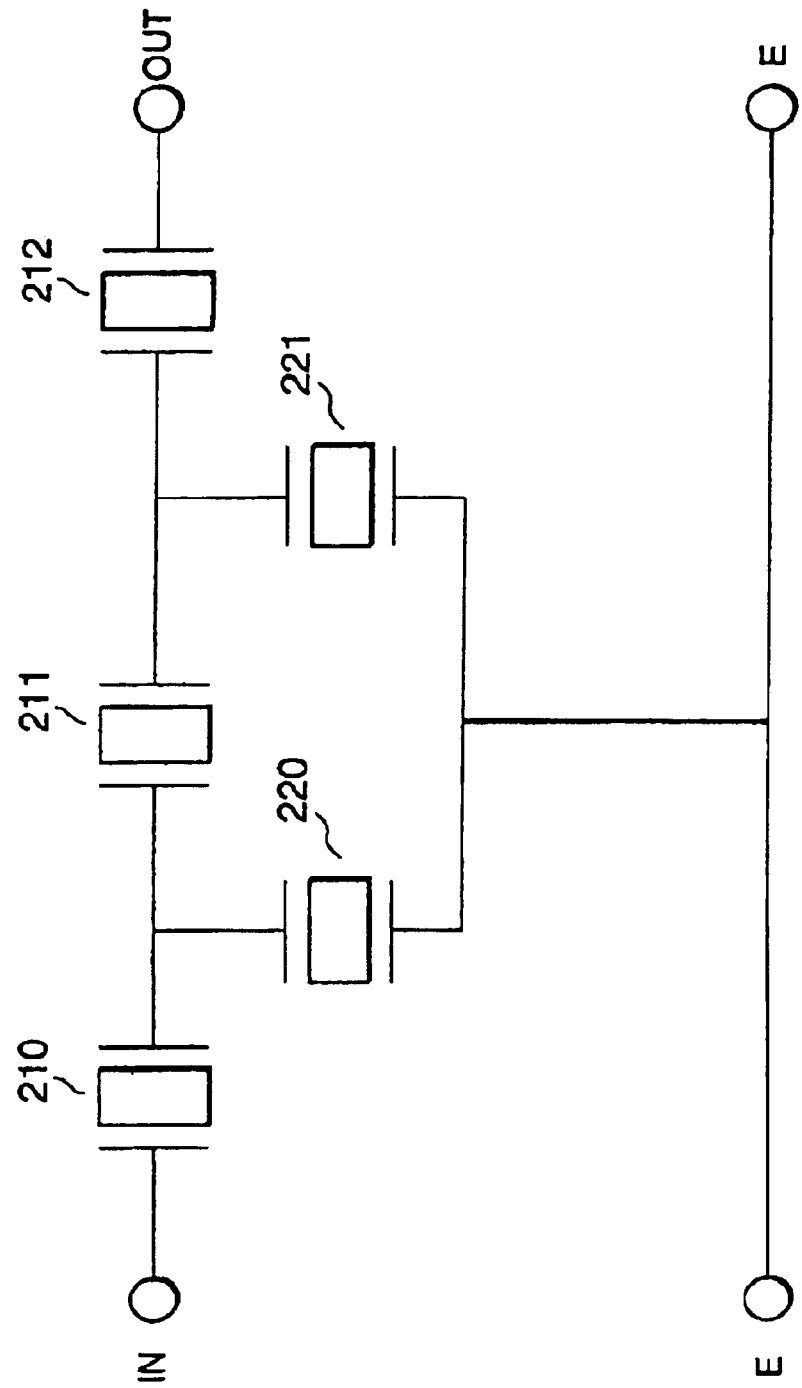
FIG. 2 is a circuit diagram of a Tx filter.

FIG. 2 is a circuit diagram of a Tx filter of the present invention.

The circuit construction of the second embodiment of the present invention is a polar construction.

In the aforementioned first embodiment, paying attention to the series arm 2 the applied power to which is the highest, the resonance frequency of the series arm 2 is changed and the resistance of the series arm 2 is reduced to lower the applied power to the series arm 2.

Contrastingly, this second embodiment is characterized in that, in the circuit of the Tx filter 200 of FIG. 2, the resistances of the parallel arms 1 and 2 are reduced and the current flowing through the series arm 2 is branched to the parallel arm 1 to lower the applied power to the series arm 2. As the means for reducing the resistances of the parallel arms, there are means for reducing the current value per unit area by enlarging the transverse length of teeth, means for also reducing the current value per unit area by increasing the number of pairs, and so on.

Table 6 shows the resistance value of each single parallel arm and the resistance value of each of the series and parallel arms when a multistage filter is assembled. The example of NO. 1 of Table 6 is the construction as the standard in the first embodiment.

TABLE 6

| | Resistance value (Ω) of parallel arm 1, 2 | Resistance values (Ω) of series and parallel arms | | | | | |
|---|---|---|---|---|---|---|---|
| No. | | Series arm 1 | Parallel arm 1 | Series arm 2 | Parallel arm 2 | Series arm 3 | |
| 1 | 15 | 1.93 | 16.0 | 3.74 | 16.0 | 1.93 | 0.5 |
| 2 | 10 | 1.93 | 11.0 | 3.71 | 11.0 | 1.93 | 0.5 |
| 3 | 7.62 | 1.93 | 8.62 | 3.66 | 8.62 | 1.93 | 0.5 |

This example in which the resistance value of the parallel arms 1 and 2 is 15Ω is a case that Q of the parallel-arm resonator is 200. Table 6 shows data in which the resistance value of only the series arm 2 reduces from 3.74Ω to 3.71Ω and further to 3.66Ω as the resistance value of the parallel arms 1 and 2 changes from 15Ω to 10Ω and further to 7.62Ω. From this data, the principle that, as the resistance value of the parallel arm is reduced, the resistance value of the series arm 2 reduces accordingly is understood.

Table 7 shows the resistance value of each single parallel arm and the power applied to each of the series and parallel arms when a multistage filter is assembled, of the second embodiment.

TABLE 7

| | Resistance value (Ω) of parallel arm 1, 2 | Applied powers (Watt) to series and parallel arms | | | | | |
|---|---|---|---|---|---|---|---|
| Unit No. | | Series arm 1 | Parallel arm 1 | Series arm 2 | Parallel arm 2 | Series arm 3 | |
| 1 | 15 | 0.060 | 0.018 | 0.076 | 0.0038 | 0.031 | 0.5 |
| 2 | 10 | 0.059 | 0.022 | 0.064 | 0.0042 | 0.024 | 0.5 |
| 3 | 7.62 | 0.059 | 0.024 | 0.056 | 0.0044 | 0.020 | 0.5 |

No. 1 of Table 7 is, as described above, the construction as the standard in the first embodiment, in which the applied power to the series arm 2 is the highest. It is found that, by reducing the resistance value of the parallel arm from 15Ω to 10Ω and further to 7.62Ω, the applied power to the series arm 2 can be reduced from 0.076W to 0.064W and further to 0.056W. Further, it is found that the applied power to the series arm 3 also exhibits the same tendency and it can be reduced from 0.031W to 0.024W and further to 0.020W. From this data, the principle that, as the resistance value of the parallel arm is reduced, the applied powers to the series arms 2 and 3 reduce accordingly is understood.

As described above, by the means for lowering the applied power to each series arm in the circuit construction of the polar Tx filter 200 of the second embodiment, a high-performance characteristic that can not be obtained by the construction of the first embodiment can be obtained. It is applicable simultaneously with that of the first embodiment.

In the second embodiment, using a technique of reducing the high-frequency resistance of the parallel arm and reducing the current flowing through the series arm to lower the applied power to the series arm, the withstand power characteristic of the polar Tx filter 200 is improved.

By the matters described in the claims, the present invention is able to reduce the current flowing through the series arm and lower the applied power to the series arm to suppress the deterioration and break of the series-arm resonator of the surface acoustic wave filter.

What is claimed is:

1. A surface acoustic wave filter comprising:
    an antenna terminal;
    a transmitting filter coupled to the antenna terminal, the transmitting filter including,
        a first end series-arm SAW resonator having a first resistance value,
        a middle series-arm SAW resonator coupled to the first end series-arm SAW resonator, wherein the middle series-arm SAW resonator has a second resistance value that is higher than the first resistance value,
    a second end series-arm SAW resonator coupled to the middle series-arm SAW resonator,
        a first parallel-arm SAW resonator coupled to the first end series-arm SAW resonator and the middle series-arm SAW resonator,
        a second parallel-arm SAW resonator coupled to the second end series-arm SAW resonator and the middle series-arm SAW resonator, the second parallel-arm SAW resonator being coupled to the first parallel-arm SAW resonator through a common node, wherein the common node is coupled to a ground potential; and
    a receiving filter coupled to the ground potential.

2. A surface acoustic wave filter as claimed in claim 1, further comprising a power amplifier coupled to apply the electrical power to the transmitting filter.

3. A surface acoustic wave filter as claimed in claim 1, further comprising a low noise amplifier coupled to the receiving filter.

4. A surface acoustic wave filter as claimed in claim 1, wherein the receiving filter has a plurality of resonators.

5. A surface acoustic wave filter as claimed in claim 4, wherein the receiving filter is a π-type filter.

6. A surface acoustic wave filter as claimed in claim 1, wherein each of the transverse length of the electrodes of the series-arm resonators is different from that of the parallel-arm resonators.

7. A surface acoustic wave filter as claimed in claim 1, wherein a number of pairs of the electrodes of each of the series-arm resonators is different from that of the parallel-arm resonators.

8. A surface acoustic wave filter comprising:
    an antenna terminal;
    a transmitting filter coupled to the antenna terminal, the transmitting filter including,
        a first end series-arm SAW resonator having a first resistance value,
        a middle series-arm SAW resonator coupled to the first end series-arm SAW resonator, the middle series-arm SAW resonator having a second resistance value that is higher than the first resistance value,
        a second end series-arm SAW resonator coupled to the middle series-arm SAW resonator, and
        a plurality of parallel-arm SAW resonators coupled to the middle series-arm SAW resonator, the parallel-arm SAW resonators being coupled in common with each other through a common node, wherein the common node is coupled to a ground potential; and
    a receiving filter coupled to the ground potential.

9. A surface acoustic wave filter as claimed in claim 8, wherein the receiving filter has a plurality of resonators.

10. A surface acoustic wave filter as claimed in claim 9, wherein the receiving filter is a π-type filter.

11. A surface acoustic wave filter as claimed in claim 8, wherein a distance between the electrodes of the first and second end series-arm resonators is different from that of the middle series-arm resonator.

* * * * *